(12) United States Patent
Staals et al.

(10) Patent No.: US 10,001,710 B2
(45) Date of Patent: Jun. 19, 2018

(54) INSPECTION APPARATUS, INSPECTION METHOD, LITHOGRAPHIC APPARATUS AND MANUFACTURING METHOD

(71) Applicant: ASML Netherlands B.V., Veldhoven (NL)

(72) Inventors: Frank Staals, Eindhoven (NL); Carlo Cornelis Maria Luijten, Duizel (NL); Paul Christiaan Hinnen, Veldhoven (NL); Anton Bernhard Van Oosten, Lommel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days. days.

(21) Appl. No.: 15/214,067

(22) Filed: Jul. 19, 2016

(65) Prior Publication Data

US 2017/0023867 A1    Jan. 26, 2017

(30) Foreign Application Priority Data

Jul. 24, 2015    (EP) .................................... 15178346

(51) Int. Cl.
  *G01B 11/04* (2006.01)
  *G03B 27/32* (2006.01)
  (Continued)

(52) U.S. Cl.
  CPC .......... *G03F 7/70633* (2013.01); *G01B 11/02* (2013.01); *G01B 11/272* (2013.01);
  (Continued)

(58) Field of Classification Search
  CPC .. G01B 11/02; G01B 11/272; G01B 2210/56; G03F 7/705; G03F 7/70616;
  (Continued)

(56) References Cited

U.S. PATENT DOCUMENTS

2004/0190008 A1  9/2004  Mieher et al.
2005/0036122 A1  2/2005  Nomura et al.
(Continued)

FOREIGN PATENT DOCUMENTS

DE  102005009554 A1  9/2006
JP     2014135368 A1  7/2014
(Continued)

OTHER PUBLICATIONS

English-Language Abstract for Japanese Patent Publication No. JP 2014135368, published Jul. 24, 2014; 1 page.
(Continued)

*Primary Examiner* — Colin Kreutzer
(74) *Attorney, Agent, or Firm* — Sterne, Kessler, Goldstein & Fox P.L.L.C.

(57) ABSTRACT

Disclosed is a method of monitoring a lithographic process parameter, such as focus and/or dose, of a lithographic process. The method comprises acquiring a first and a second target measurement using respectively a first measurement configuration and a second measurement configuration, and determining the lithographic process parameter from a first metric derived from said first target measurement and said second target measurement. The first metric may be difference. Also disclosed are corresponding measurement and lithographic apparatuses, a computer program and a method of manufacturing devices.

20 Claims, 6 Drawing Sheets

(51) Int. Cl.
*G03B 27/74* (2006.01)
*G03C 5/00* (2006.01)
*G03F 7/20* (2006.01)
*G01B 11/02* (2006.01)
*G01B 11/27* (2006.01)

(52) U.S. Cl.
CPC ...... *G03F 7/70625* (2013.01); *G03F 7/70641* (2013.01); *G01B 2210/56* (2013.01)

(58) Field of Classification Search
CPC ............. G03F 7/70625; G03F 7/70633; G03F 7/70641; G03F 7/70683; H01L 22/12
USPC .................. 355/67, 68, 77; 356/636; 430/30
See application file for complete search history.

(56) References Cited

U.S. PATENT DOCUMENTS

| | | |
|---|---|---|
| 2005/0185174 A1 | 8/2005 | Laan et al. |
| 2006/0033921 A1 | 2/2006 | Boef et al. |
| 2006/0066855 A1 | 3/2006 | Boef et al. |
| 2008/0018874 A1 | 1/2008 | Dusa et al. |
| 2008/0137052 A1 | 6/2008 | Takahiro |
| 2008/0192221 A1 | 8/2008 | Mieher et al. |
| 2009/0284722 A1 | 11/2009 | Gabor et al. |
| 2010/0081068 A1 | 4/2010 | Kim |
| 2010/0201963 A1 | 8/2010 | Cramer et al. |
| 2010/0328655 A1 | 12/2010 | Boef |
| 2011/0027704 A1 | 2/2011 | Cramer et al. |
| 2011/0043791 A1 | 2/2011 | Smilde et al. |
| 2011/0069292 A1 | 3/2011 | Boef |
| 2011/0102753 A1 | 5/2011 | Van De Kerkhof et al. |
| 2012/0044470 A1 | 2/2012 | Smilde et al. |
| 2012/0120396 A1* | 5/2012 | Kandel .................. G01B 11/24 356/399 |
| 2012/0123581 A1 | 5/2012 | Smilde et al. |
| 2013/0258310 A1 | 11/2013 | Smilde et al. |
| 2013/0271740 A1 | 11/2013 | Quintanilha |

FOREIGN PATENT DOCUMENTS

| | | |
|---|---|---|
| WO | WO 2013/079270 A1 | 6/2013 |
| WO | WO 2013/178422 A1 | 12/2013 |

OTHER PUBLICATIONS

English-Language Abstract for Dutch Patent Publication No. DE 102005009554, published Sep. 21, 2006; 1 page.

International Search Report and Written Opinion of the International Search Authority directed to related International Patent Application No. PCT/EP2016/066110, dated Oct. 21, 2016; 10 pages.

* cited by examiner

INSPECTION APPARATUS, INSPECTION METHOD, LITHOGRAPHIC APPARATUS AND MANUFACTURING METHOD

BACKGROUND

Field of the Invention

The present invention relates to inspection apparatus and methods usable, for example, to perform metrology in the manufacture of devices by lithographic techniques. The invention further relates to such methods for monitoring a parameter such as focus and/or dose during or following a lithographic process.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 µm by 40 µm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature. Traditionally, optimal settings were determined by "send-ahead wafers" i.e. substrates that are exposed, developed and measured in advance of a production run. In the send-ahead wafers, test structures are exposed in a so-called focus-energy matrix (FEM) and the best focus and energy settings are determined from examination of those test structures.

Another method of determining focus and/or dose has been through diffraction based focus techniques. Diffraction based focus may use target forming features on the reticle which print targets having a degree of asymmetry which is dependent on the focus and/or dose setting during printing. This degree of asymmetry can then be measured and the focus and/or dose inferred from the asymmetry measurement. Such focus measuring methods, and the associated test structure designs have a number of drawbacks. Many test structures require subresolution features or grating structures with large pitches. Such structures may contravene design rules of the users of lithographic apparatuses. Focus measuring techniques may comprise measuring asymmetry in opposite higher (e.g., first) order radiation scattered by special, focus dependent, target structures and determining focus from this asymmetry. Such asymmetry based techniques may require careful selection of target geometries to ensure a desired relationship (e.g., monotonic or linear) between asymmetry and focus. This selection process can be complex and require significant effort to find a suitable target geometry. It may even be the case that no suitable target geometry exists.

SUMMARY OF THE INVENTION

The present invention aims to address one or more of the above identified drawbacks.

The invention in a first aspect provides a method of monitoring a lithographic process parameter of a lithographic process, said method comprising: acquiring a first target measurement, said first target measurement having been obtained from inspection of a target performed with a first measurement configuration; acquiring a second target measurement, said second target measurement having been obtained from inspection of a target performed with a second measurement configuration, wherein at least one measurement parameter is varied between said first measurement configuration and said second measurement configuration; and determining the lithographic process parameter from a first metric derived from said first target measurement and said second target measurement.

The invention yet further provides a method of manufacturing devices wherein a device pattern is applied to a series of substrates using a lithographic process, the method including:

using the method of any of the first aspect to monitor said lithographic process parameter parameter, and controlling the lithographic process for later substrates in accordance with the determined lithographic process parameter parameter.

The invention yet further provides a computer program product comprising machine-readable instructions for causing a processor to perform the method of the first aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXEMPLARY EMBODIMENTS

Before describing embodiments of the invention in detail, it is instructive to present an example environment in which embodiments of the present invention may be implemented.

Figure 1:
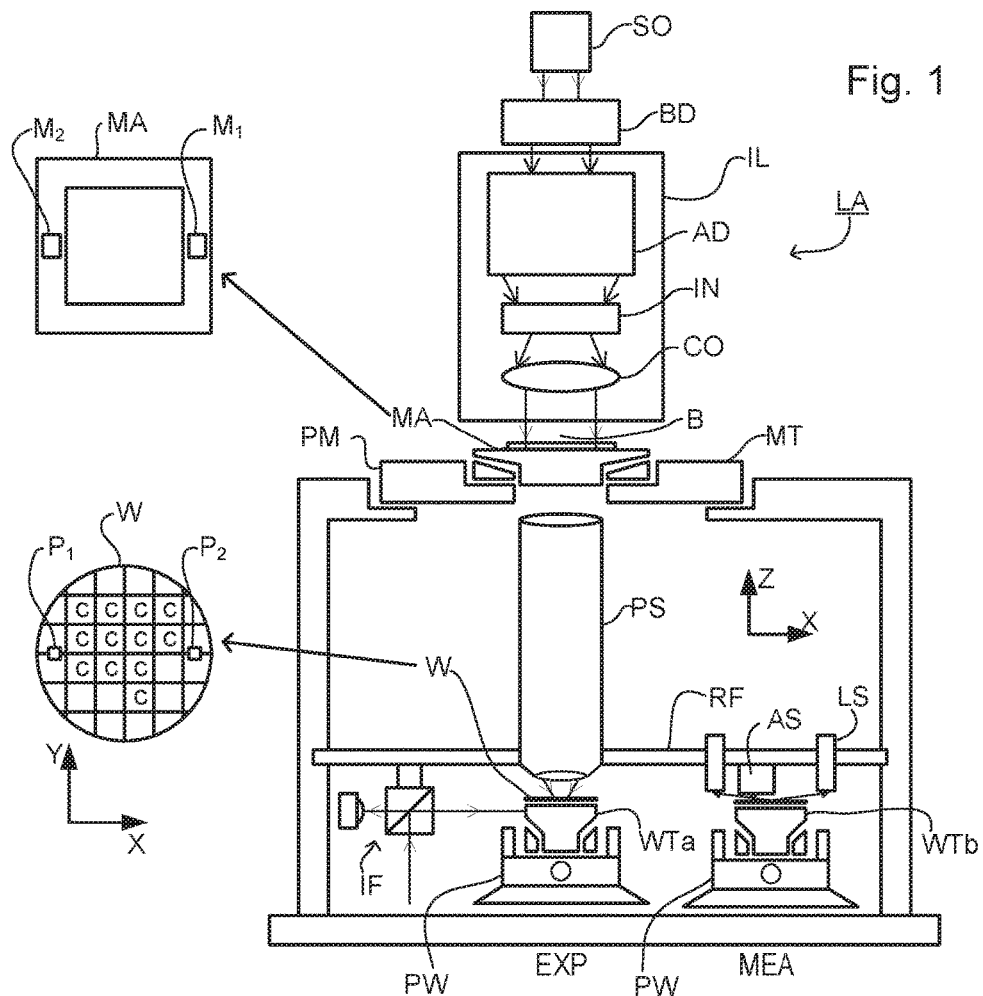
FIG. 1 depicts a lithographic apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can take many forms, The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., reticle/mask) MA with respect to the path of the radiation beam B, e.g., after mechanical retrieval from a mask library, or during a scan.

Patterning device (e.g., reticle/mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
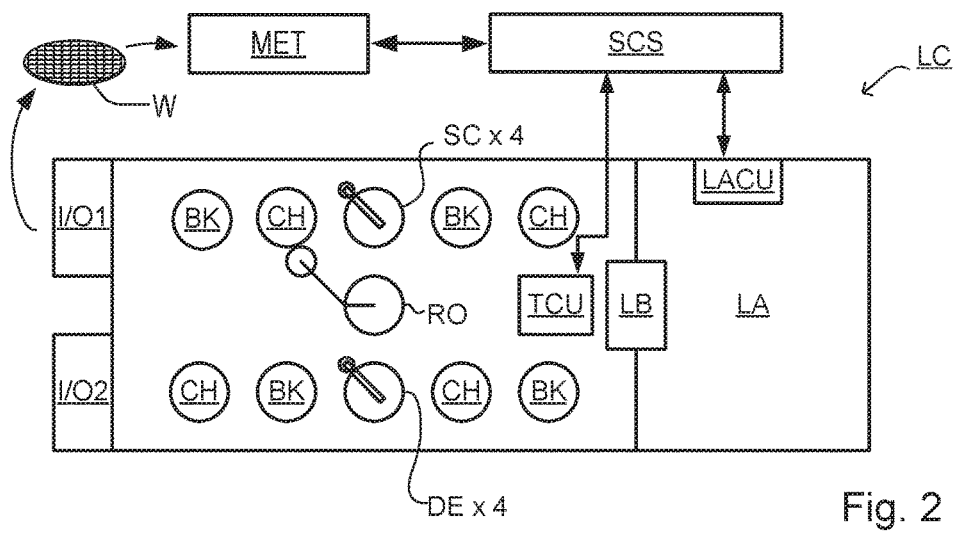
FIG. 2 depicts a lithographic cell or cluster in which an inspection apparatus according to the present invention may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
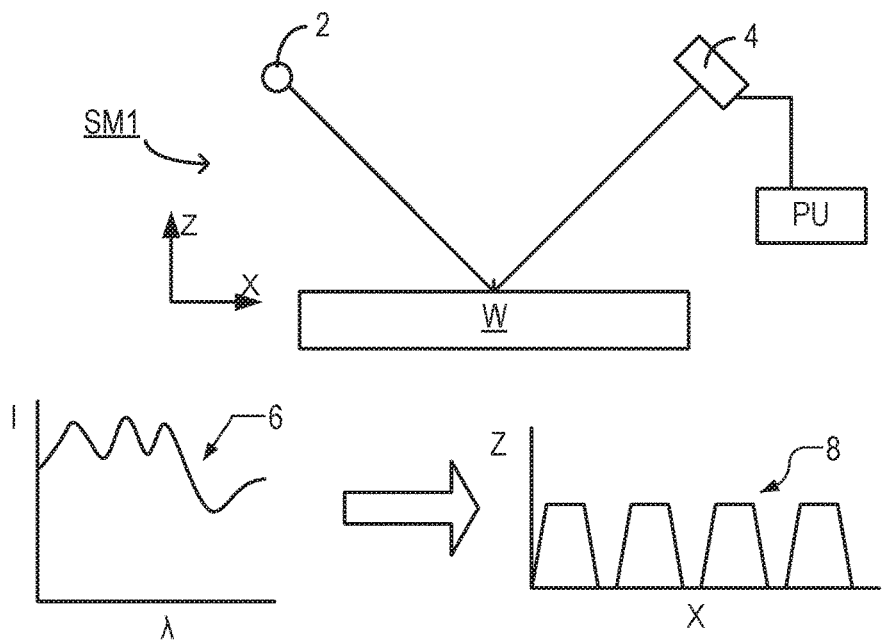
FIG. 3 illustrates the principles of operation of a spectroscopic scatterometer as a first example of an inspection apparatus.

FIG. 3 depicts a known spectroscopic scatterometer which may be used as an inspection apparatus in a metrology system of the type described above. It comprises a broadband (white light) radiation projector 2 which projects radiation onto a substrate W. The reflected radiation is passed to a spectrometer 4, which measures a spectrum 6 (intensity as a function of wavelength) of the specular reflected radiation. From this data, the structure or profile 8 giving rise to the detected spectrum may be reconstructed by calculation within processing unit PU. The reconstruction can be performed for example by Rigorous Coupled Wave Analysis and non-linear regression, or comparison with a library of pre-measured spectra or pre-computed simulated spectra. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
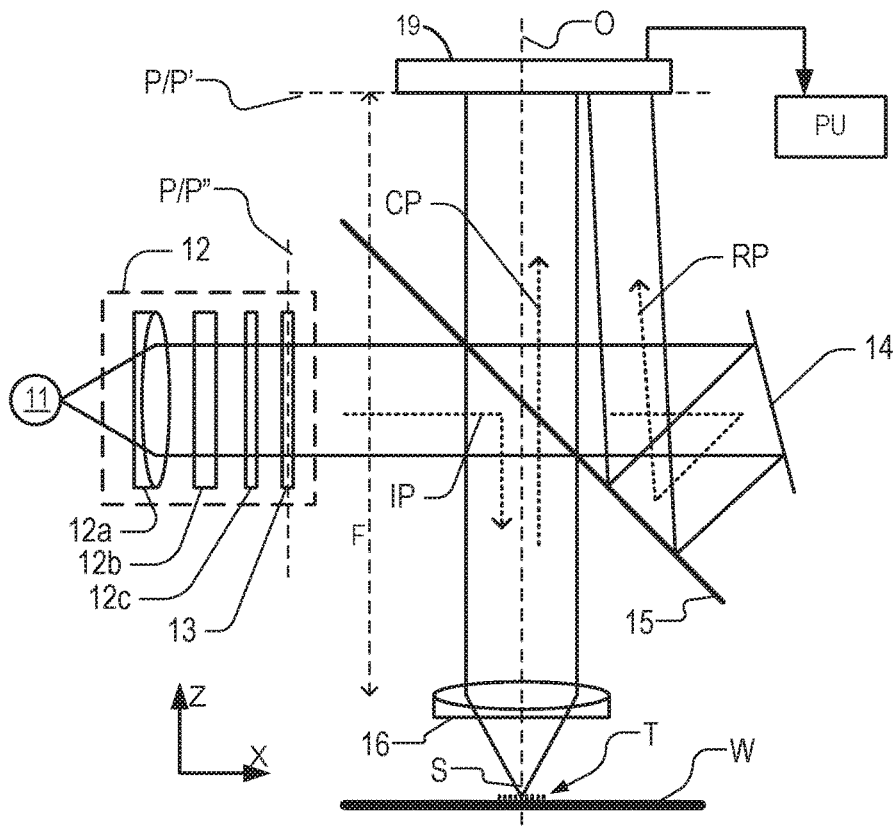
FIG. 4 illustrates in schematic form an angle-resolved scatterometer as another example of an inspection apparatus.

FIG. 4 shows the basic elements of a known angle-resolved scatterometer that may be used instead of or in addition to a spectroscopic scatterometer. In this type of inspection apparatus, radiation emitted by a radiation source 11 is conditioned by an illumination system 12. For example, illumination system 12 may include a collimating using lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain with numerical apertures over 1 if desired.

As in the lithographic apparatus LA, one or more substrate tables may be provided to hold the substrate W during measurement operations. The substrate tables may be similar or identical in form to the substrate tables WTa, WTb of FIG. 1. (In an example where the inspection apparatus is integrated with the lithographic apparatus, they may even be the same substrate tables.) Coarse and fine positioners may be configured to accurately position the substrate in relation to a measurement optical system. Various sensors and actuators are provided for example to acquire the position of a target of interest, and to bring it into position under the objective lens 16. Typically many measurements will be made on targets at different locations across substrate W. The substrate support can be moved in X and Y directions to acquire different targets, and in the Z direction to obtain a desired focusing of the optical system on the target. It is convenient to think and describe operations as if the objective lens and optical system being brought to different locations on the substrate, when in practice the optical system remains substantially stationary and only the substrate moves. Provided the relative position of the substrate and the optical system is correct, it does not matter in principle whether one or both of those is moving in the real world.

When the radiation beam is incident on the beam splitter 16 part of it is transmitted through the beam splitter and follows a reference path RP towards a reference mirror 14.

Radiation reflected by the substrate, including radiation diffracted by any metrology target T, is collected by lens 16 and follows a collection path CP in which it passes through partially reflecting surface 15 into a detector 19. The detector may be located in the back-projected pupil plane P, which is at the focal length F of the lens 16. In practice, the pupil plane itself may be inaccessible, and may instead be re-imaged with auxiliary optics (not shown) onto the detector located in a so-called conjugate pupil plane P'. The detector is preferably a two-dimensional detector so that a two-dimensional angular scatter spectrum or diffraction spectrum of a substrate target 30 can be measured. In the pupil plane or conjugate pupil plane, the radial position of radiation defines the angle of incidence/departure of the radiation in the plane of focused spot S, and the angular position around an optical axis O defines azimuth angle of the radiation. The detector 19 may be, for example, an array of CCD or CMOS sensors, and may use an integration time of, for example, 40 milliseconds per frame.

Radiation in reference path RP is projected onto a different part of the same detector 19 or alternatively on to a different detector (not shown). A reference beam is often used for example to measure the intensity of the incident radiation, to allow normalization of the intensity values measured in the scatter spectrum.

The various components of illumination system 12 can be adjustable to implement different metrology 'recipes' within the same apparatus. Color filter 12b may be implemented for example by a set of interference filters to select different wavelengths of interest in the range of, say, 405-790 nm or even lower, such as 200-300 nm. An interference filter may be tunable rather than comprising a set of different filters. A grating could be used instead of interference filters. Polarizer 12c may be rotatable or swappable so as to implement different polarization states in the radiation spot S. Aperture device 13 can be adjusted to implement different illumination profiles. Aperture device 13 is located in a plane P''' conjugate with pupil plane P of objective lens 16 and the plane of the detector 19. In this way, an illumination profile defined by the aperture device defines the angular distribution of light incident on substrate radiation passing through different locations on aperture device 13.

The detector 19 may measure the intensity of scattered light at a single wavelength (or narrow wavelength range), the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PS. Illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

In addition to measurement of parameters by reconstruction, angle resolved scatterometry is useful in the measurement of asymmetry of features in product and/or resist patterns. A particular application of asymmetry measurement is for the measurement of a focus parameter (for example, the focus setting during exposure of the target) from targets which print with a focus dependent asymmetry. The concepts of asymmetry measurement using the instrument of FIG. 3 or 4 are described for example in published patent application US2006066855A1 cited above. Simply stated, while the positions of the diffraction orders in the diffraction spectrum of the target are determined only by the periodicity of the target, asymmetry of intensity levels in the diffraction spectrum is indicative of asymmetry in the individual features which make up the target. In the instrument of FIG. 4, where detector 19 may be an image sensor, such asymmetry in the diffraction orders appears directly as asymmetry in the pupil image recorded by detector 19. This asymmetry can be measured by digital image processing in unit PU, and from this, focus can be determined.

Figure 5A:
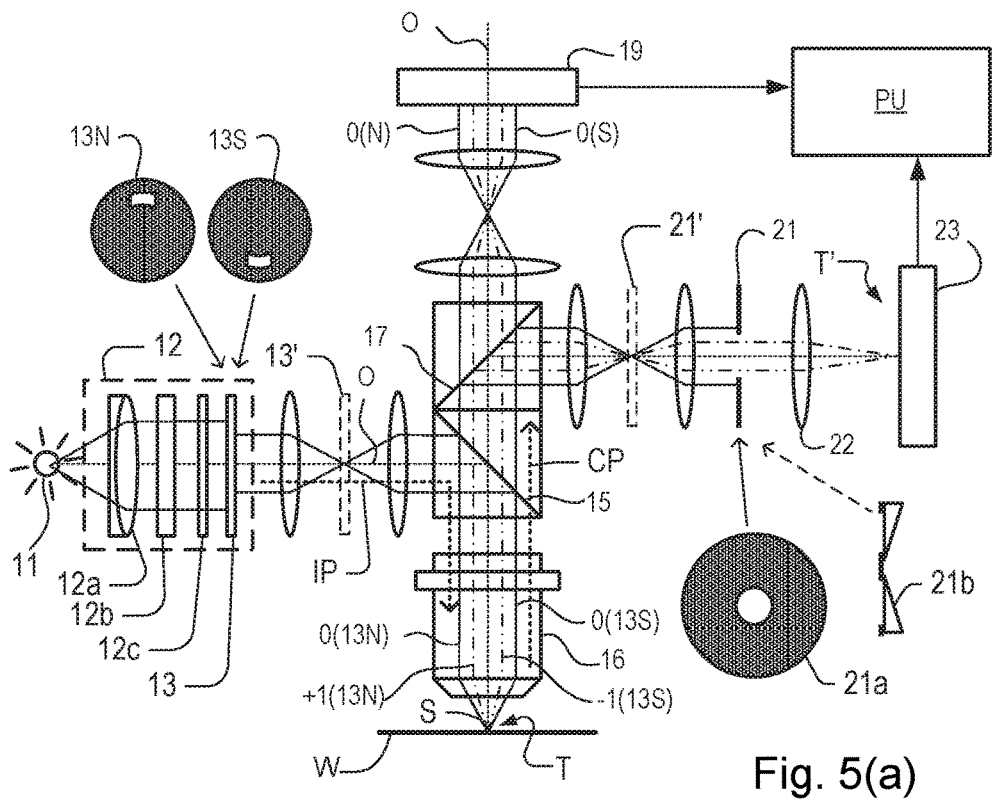
FIGS. 5(a)-5(b) illustrate schematically an inspection apparatus adapted to perform angle-resolved scatterometry and dark-field imaging inspection methods.

FIG. 5(a) shows in more detail an inspection apparatus implementing angle-resolved scatterometry by the same principles as the apparatus of FIG. 4, with additional adaptations for performing so-called dark field imaging. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating T and diffracted rays are illustrated in more detail in FIG. 5(b).

The same reference numbers are used for components described already in the FIG. 4 apparatus. The illumination path is labeled IP as before. The reference path RP is omitted, for clarity. Compared with that apparatus, a second beam splitter 17 divides the collection path into two branches. In a first measurement branch, detector 19 records a scatter spectrum or diffraction spectrum of the target exactly as described above. This detector 19 may be referred to as the pupil image detector.

In the second measurement branch, imaging optical system 22 forms an image of the target on the substrate W on sensor 23 (e.g. a CCD or CMOS sensor). An aperture stop 21 is provided in a plane that is in the collection path in a plane conjugate to the pupil-plane (it may also be called a pupil stop). Aperture stop 21 can take different forms, just as the illumination aperture can take different forms. Typically, aperture stop 21 functions to block the zeroth order diffracted beam so that the image of the target formed on sensor 23 is formed only from the first order beam(s). This is the so-called dark field image, equivalent to dark field microscopy. The images captured by sensors 19 and 23 are output to image processor and controller PU, the function of which will depend on the particular type of measurements being performed.

In the illumination path in this example, additional optics are shown such that a field stop 13' can be placed in a plane conjugate with the plane of the target and the image sensor 23. This plane may be referred to as a field plane, or conjugate image plane, and has the property that each spatial position across the field plane corresponds to a position across the target. This field stop may be used for example to shape the illumination spot for a particular purpose, or simply to avoid illuminating features that are within the field of view of the apparatus but not part of the target of interest. The following drawings and discussion refer, by way of example, to techniques for implementation of the function of aperture device 13, but the present disclosure also encompasses use of the same techniques to implement the function of field stop 13'.

Figure 5B:
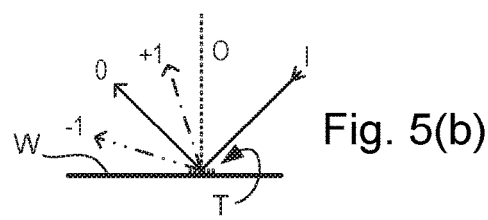

As shown in more detail in FIG. 5(b), target grating T is placed with substrate W normal to the optical axis O of objective lens 16. In the case of an off-axis illumination profile, a ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Different modes of illumination are possible by using different apertures. Apertures 13N ('north') and 13S ('south') each provide off-axis illumination from a specific narrow range of angles only. Returning to FIG. 5(a), this is illustrated by designating diametrically opposite portions of the annular aperture as north (N) and south (S). The +1 diffracted rays from the north portion of the cone of illumination, which are labeled +1(13N), enter the objective lens 16, and so do the −1 diffracted rays from the south portion of the cone (labeled −1(13S)). As described in the prior applications mentioned in the introduction, using the dark-field imaging sensor 23 while switching between apertures 13N, 13S of this type is one way of obtaining asymmetry measurements from multiple small targets. Aperture stop 21a can be used to block the zeroth order radiation when using off-axis illumination.

While off-axis illumination is shown, on-axis illumination of the targets may instead be used and an aperture stop with an off-axis aperture is used to pass substantially only one first order of diffracted light to the sensor. In one example, prisms 21b are used in place of aperture stop 21 which have the effect of diverting the +1 and −1 orders to different locations on sensor 23 so that they can be detected and compared without making two images. This technique, is disclosed in the above-mentioned published patent application US2011102753A1, the contents of which are hereby incorporated by reference. 2nd, 3rd and higher order beams (not shown in FIG. 5) can be used in measurements, instead of or in addition to the first order beams.

When monitoring a lithographic process, it is desirable to monitor a lithographic process parameter such as focus of the lithography beam on the substrate. One known method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays 2nd order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also this method is sensitive to inter alia dose and process variation (crosstalk).

To address these issues, diffraction based focus (DBF) was devised. Diffraction based focus may use target forming features on the reticle which print targets having a degree of asymmetry which is dependent on the focus setting during printing. This degree of asymmetry can then be measured using a scatterometery based inspection method, for example by measuring the intensity asymmetry between the intensities of +1st and −1st order radiation diffracted from the target, to obtain a measure of the focus setting.

Figure 6:
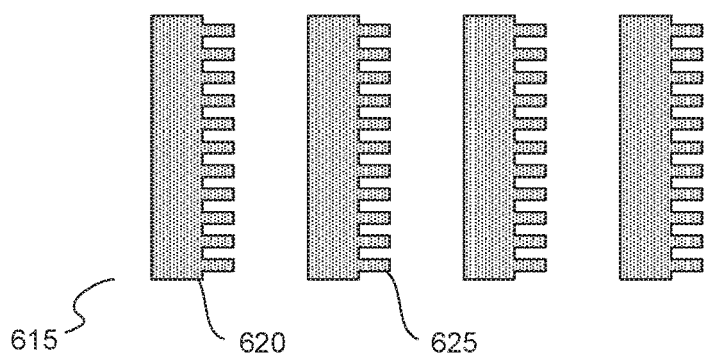
FIG. 6 illustrates target forming elements on a reticle suitable for forming a grating on a substrate having focus dependent asymmetry.

FIG. 6 illustrates DBF target forming design 615 configured for diffraction based focus measurements. It comprises plural DBF structures 620, each of which comprises high resolution substructures 625. The high resolution substructures 625 on top of a base pitch creates an asymmetric resist profile for each DBF structure 620, with the degree of asymmetry being dependent upon focus. Consequently a metrology tool can measure the degree of asymmetry from a target formed using DBF target forming design 615 and translate this into the scanner focus.

While the DBF target forming design 615 enables diffraction based focus measurements, it is not suitable for use in all situations. Such structures may not comply with the strict design constraints applicable to certain product structures. During the chip making process all features on the reticle must print and stand up to subsequent processing steps. Semiconductor manufacturers use design rules as a means to restrict the feature designs to ensure the printed features conform to their process requirements. An example of such a design rule relates to the allowable size of structures or pitches. Another example design rule relates to pattern density, which may restrict the density of a resulting resist pattern to be within a particular range.

It is therefore proposed to monitor a lithographic process parameter, such as (for example) focus, dose, contrast or aberration, by performing at least a first measurement of at least one target with a first measurement configuration and a second measurement of at least one target with a second measurement configuration, The difference between the first measurement configuration and the second measurement configuration may comprise a change in at least one measurement parameter. In an embodiment, the change in measurement parameter may be provided by using a first measurement radiation to perform the first measurements and a second measurement radiation to perform the second measurements. The first and second measurement radiation may differ in one or more of: wavelength, polarization and aperture profile. In other embodiments, the change in measurement parameter may be provided by measuring different targets for the first and second measurements. The different targets may comprise different designs, which may differ from one another in terms of a target parameter such as (for example) pitch and/or critical dimension. "Target" should be construed widely to include areas of actual product, or of no features (thin film), and different targets may comprise any combinations of one or more different purposely formed measurement targets (e.g., line-space gratings), one or more different product targets and/or thin film targets. In another embodiment, a change in measurement parameter may comprise a difference in angular detection distribution (e.g. variation in angular distribution or the angle of incidence on the detection sensor) between the first measurement and second measurement. This could mean using measurement data from different areas in the measured image pupil. In other embodiments, for example in dark field imaging, this could include the use of different illumination modes (different aperture profile and therefore different angle of incidence on the target, as already mentioned).

More than two measurements may be made. This can help with cancelling process effects or tool-to-tool effects. The different measurements may have any combination of one or more measurement parameters varied between measurements.

The focus (and dose) response with a measured value for a target parameter (for example CD or other measurements as will be described below) may take the form of a Bossung curve for each of the first measurement and second measurement. Focus and/or dose is a function of a first measurement value of a target parameter obtained from the first measurement and of a second measurement value of a target parameter obtained from the second measurement. Therefore, it is proposed that first and second measured values of a parameter from the first and second measurements be obtained and a value for the lithographic process parameter, for example focus and/or dose (or any other parameter of a lithographic process), determined from a first metric derived from these first and second measurement values. Other embodiments may include deriving the first metric from first and second measurements of a target parameter which show no such Bossung relationship with the lithographic process parameter. The relationship may be linear in each case (e.g., with different slopes).

In this way, the use of sub-resolution features and the limitations on the size of the pitches or structures is obviated when compared to DBF techniques. There is no longer a requirement for a specific DBF structures designed to impose a focus/dose dependent asymmetry in the printed structure on the wafer. Conventional targets (e.g., line-space gratings) can be used instead.

A specific example of how focus may be derived is described below, with reference to FIG. 7. However, the skilled person will realise that there are many alternative methods that allow focus, dose or any suitable parameter to be extracted from the first and second measurements. The description below will, for the sake of simplicity, mainly discuss the concepts disclosed in terms of obtaining focus values. However, the concepts are equally applicable to obtaining dose values, or any other lithographic process parameter. In an embodiment, other lithographic process parameters may comprise those which show a Bossung relationship with a measured value for a target parameter. The principles are analogous for all such parameters. In general, the description below discusses a first metric derived from the first and second measurement values as being a first difference comprising the difference of the first and second measurement values. However, other mathematical operations and methods may be used to extract a focus value. For example, the first metric may comprise the result of a division of one of the first or second measurement values into the other measurement value. Other linear or non-linear combinations of the first and second measurement values can instead be used for the first metric.

Figure 7A:
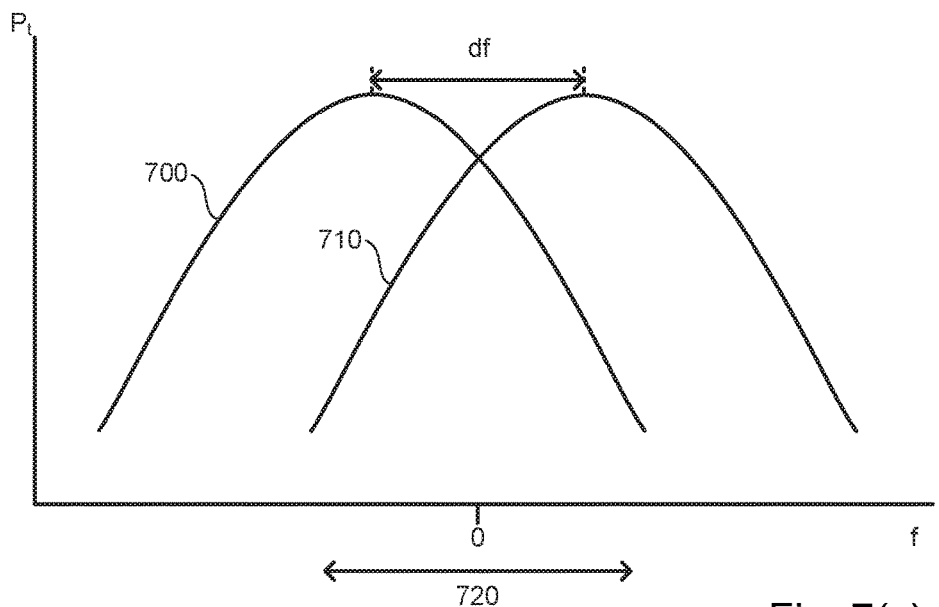
FIGS. 7(a)-7(b) show (a) a plot of a measured value for a target parameter (y-axis) against a lithographic process parameter (e.g., focus) for a target using measurement radiation of different wavelengths; and (b) a plot of the difference between measured values for a target parameter using the first wavelength radiation and the second wavelength radiation (y-axis) against the lithographic process parameter (x-axis)
Figure 7B:
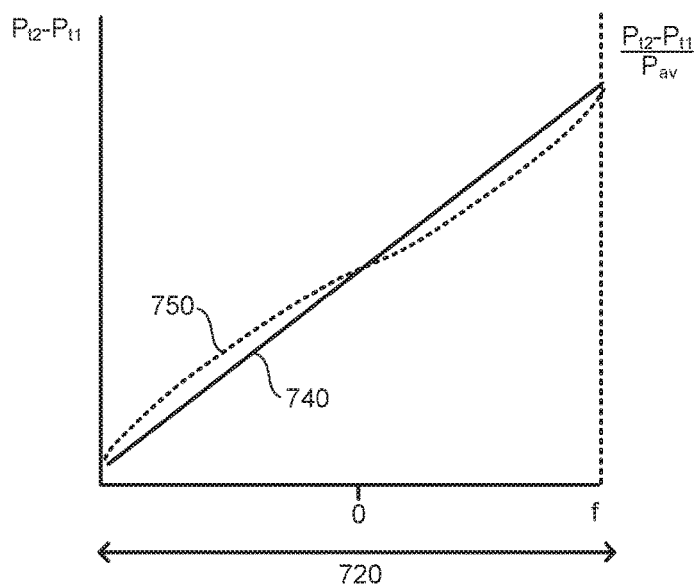

FIG. 7(a) shows a plot of a measured value for a target parameter Pt against focus f for both the first measurement and second measurement. It shows a first Bossung curve 700 corresponding to the first measurement and a second Bossung curve 710 corresponding to the second measurement. As can be seen, Bossung curve 700 and Bossung curve 710 are essentially similar, but shifted by a focus offset df. The Bossung curve overlap 720 is the focus range through which a difference (the first difference) of the measured value for the target parameter for the first measurement and for the second measurement has a substantially or approximately monotonic, and in this example, linear relationship with focus. This is illustrated in FIG. 7(b), which is a plot of this difference Pt2−Pt1 (where Pt1 is the measured value for the target parameter for the first measurement and Pt2 is the measured value for the target parameter for the second measurement) against focus. As can be seen, the relationship 740 here is substantially linear. The Pt2-Pt1 metric may be sensitive to crosstalk, e.g. by dose and/or process (for example due to resist height dependent scaling). A more robust metric may be (Pt2−Pt1)/PtAV, where PtAV, is the average of Pt2 and Pt1. The relationship 750 (dotted) of (Pt2−Pt1)/PtAV with focus is also shown in FIG. 7(b). This relationship is still sufficiently linear while being more robust against crosstalk. The differential provides robustness against offset errors, the scaling provides robustness against scaling errors.

While the first and second measurements are mostly described above in terms of differing by using first measurement radiation and second measurement radiation (and specifically where the first measurement radiation has a first wavelength and the second measurement radiation has a second wavelength), they can differ in terms of another measurement parameter. In an embodiment, the measurement parameter varied is such that there is a Bossung shift, that is a shift in the position of the Bossung curve as illustrated in FIG. 7(a), between measurements with the first measurement configuration and measurements with the second measurement configuration. Such a Bossung shift is demonstrated, for example, when the first measurement configuration comprises using first measurement radiation of a first wavelength (or polarization) and the second measurement configuration comprises using second measurement radiation of a second wavelength (or polarization). Where more than two measurements are made with different measurement configurations such that more than one measurement parameter is varied, it may be that the variation of only one measurement parameter shows this Bossung shift. The variation of other measurement parameters may yield measurements which are used only for cancelling of processing or tool effects.

In the specific example illustrated, where the relationship 740 is linear, the slope of relationship 740 or relationship 750 can be described by a constant C which is dependent upon the difference in the varied measurement parameter between the first and second measurements, and of the Bossung curvature. For example, the difference in the varied measurement parameter may be the difference in the wavelength of the measurement radiation used to obtain the first measurement and the wavelength of the measurement radiation used to obtain the second measurement Accordingly, focus can be obtained from the following equation (Equation 1):

$$f = \frac{P_{t2} - P_{t1}}{C \cdot P_{tAV}}$$

where PtAV in the denominator is optional. Of course, when there is a non-linear monotonic relationship 740, or where a first metric other than difference is used, focus can be found by an appropriate mathematical operation based on the relationship and metric used. In an example, where the Bossung curvature shows fourth order behaviour, the difference will not be linear, but will include a third order component. As already disclosed, this principle is equally applicable to lithographic process parameters other than focus and that a suitable combination of the first and second measurement (the first metric—whether this be difference or otherwise) shows a monotonic or linear relationship with the lithographic process parameter. In other methods described (using machine learning as disclosed below), the relationship need not even be monotonic.

In one embodiment, it is proposed to obtain the focus value from only the first metric (derived from the first and second measurements). In this embodiment, the first metric, is used to extract the focus value. Where the first metric is a first difference, this difference cancels for at least some of the effects of process sensitivity and/or measurement tool differences on the first and second measurements. To some extent, a measurement will show some dependence on process aspects (process settings and process conditions, such as temperature) and on the actual tool used. Taking the difference of two measurements performed under similar conditions (for example, with only one measurement parameter changed, such as measurement radiation wavelength), and using the same measurement tool, should cancel many of these process and tool dependent effects. The skilled person will realise that the downside of using a difference in this manner is that there will be a sensitivity reduction when compared to the most sensitive of the two measurements through focus (or other relevant parameter).

In an embodiment, a pupil image can be obtained for each of these measurements. A pupil image is an image obtained of the pupil plane using a measurement tool such as that shown in FIG. 4 or of the first measurement branch of the measurement tool of FIG. 5. The pupil image may be obtained from zeroth order scattered radiation as this has the benefit of there being no particular target pitch requirements for capturing the scattered radiation. Using higher orders is another alternative and is described in greater detail below.

In such a pupil image embodiment, a combination pupil image may be derived from a combination (for example a difference) of a first pupil image from the first measurement and of a second pupil image of the second measurement. This combination may be performed in a number of ways. In an embodiment, the combination pupil image is a difference pupil image derived from a difference of the first and second pupil images. More specifically, the difference pupil image may be derived from a difference of a parameter such as intensity for each pixel of the first pupil image and a corresponding pixel of the second pupil image. In the resulting difference pupil image, a region of interest can be identified and the first metric defined as or derived from an average value for the parameter determined for the pixels within the region of interest. Inside such regions of interest, it can be shown that the sensitivity of intensity to focus and/or dose is relatively consistent and therefore such averaging is valid.

Other variations may include obtaining the first metric from subtraction of pixels within each pupil image (in which case the varied measurement parameter would be the detection angular distribution). Alternatively, or in addition, the pixels within the first and second pupil images may initially be averaged, and the difference of these averages subsequently calculated to obtain the first metric.

In another embodiment, the first and second measurements can be made using dark field imaging (conjugate image plane). Such measurements may be performed using a measurement tool such as the second measurement branch of the measurement tool of FIG. 5. In such an embodiment, the combination (e.g., difference) may be such that the first measurement is a first intensity measurement from a first diffraction image and the second measurement may be a second intensity measurement from a second diffraction image. Consequently, the first metric may be a difference of the first intensity measurement and the second intensity measurement. Dark field imaging has the advantage of being able to use smaller targets and to perform measurements on more than one target simultaneously. For example, where the measurement tool allows measurement radiation having different wavelengths for different regions within the measurement field, the two measurements can be performed simultaneously.

When measuring directly product features, or when using underfill of the target in the measurement field, there may be a positioning inaccuracy in the substrate plane. In pupil mode measurements there is no way to correct for such positioning inaccuracy, so it has to be assumed that the relative measurement area does not change significantly. In dark field mode, however, pattern recognition techniques can be employed (with respect to the image acquired during a calibration phase) and one or more regions of interest can be identified from the resultant image on the sensor. This may be beneficial (when measuring product features directly) when it is possible to indicate which area is most focus sensitive (or dose/other parameter sensitive, as appropriate), as previously determined or most relevant (process window based). A relevant area may comprise features having the smallest tolerance for focus and/or dose errors (i.e. smallest Depth of Focus or Exposure Latitude, as appropriate). Of course, when specifically formed metrology targets are measured, the regions of interest will be the (non-edge) location of the targets.

The difference between the values for the varied measurement parameter (for example, the first wavelength and second wavelength) should be sufficient to achieve an appreciable separation of the corresponding Bossung relationships. The larger this difference, the greater the first metric's sensitivity with focus will be. However, this increased sensitivity will come at a cost of a greater difference in processing and tool dependent effects, and therefore a reduction in the cancellation of these effects in the first metric. As a result of this, there may be a preferred compromise between process effect cancellation and focus sensitivity. Therefore a number of different measurements using different combinations or variations in values for the varied measurement parameter may be made and assessed. For example, in a specific embodiment, one or both of the first measurement and the second measurement may use measurement radiation comprising multiple wavelengths (either multiple individual wavelengths or continuous bands). Alternatively, or in addition, more measurements may be performed, each with radiation of different wavelengths, so that alternative wavelength differences can be evaluated. In a specific example, the wavelength difference may be smaller than 200 nm, may be smaller than 100 nm, or may be smaller than 75 nm.

It was briefly mentioned that the difference between the first and second measurements may optionally be divided by an average of the measurements. This may be achieved by dividing the difference with the sum of the first and second measurements. This normalises the calculated difference, making the result less sensitive to scaling, for example, with changes in resist height.

It may be that the first metric (e.g., the first difference) does not cancel for as much of the process and tool dependency as is desirable. Consequently, it may be desirable to obtain at least a second metric, and in a specific example a second difference, to further cancel for process and tool dependency. In an embodiment, this may be achieved by performing additional measurements with different measurement configurations. For example, such additional measurements may be performed on at least one additional target. As already mentioned, the term target here should be construed widely. A target may be a grating formed for the express purpose of measurement. However, a target within the context of the disclosure may equally include "thin film" (areas of resist without patterning) or actual product features.

In an embodiment, there may be four measurements. A first measurement of a first target with first measurement radiation, a second measurement of the first target with second measurement radiation, a third measurement of a second target with the first measurement radiation and a fourth measurement of the second target with the second measurement radiation. The first metric may comprise a difference of the first measurement and the second measurement from the first target, and the second metric may comprise a difference of the third measurement and the fourth measurement from the second target. Both of these first and second metrics can (optionally) be normalised as has already been described, e.g., by dividing by the sum of the first and second measurements, or third and fourth measurements, as applicable. Following this, the difference between the first metric and second metric is determined and used to derive the lithographic process parameter.

In any embodiment where different targets are used, the targets may comprise first and second targets. In such an embodiment, the first and second targets may comprise the same pitch, but different critical dimension (CD). In a specific embodiment, the first target may comprise a line target and the second target may comprise a trench target. By way of example, the line target may have the width of each of its lines approximately equal to the width of each trench in the trench target. Similarly, the line target may have the width of each of its trenches approximately equal to the width of each line in the trench target. Consequently, the pitches of the two targets will be approximately equal, or at least similar. An advantage of such an arrangement is that the Bossung response with focus of the trench target will be the same as that of the line target, except inverted. This will mean that the difference will increase sensitivity by effectively doubling the signal (gaining a factor ~42 in focus noise).

As an alternative, the different targets may comprise a first target have either a line target or trench target, or indeed any other type of target which shows a Bossung relationship with focus; and a second target which shows no signal variation with focus. The second target may comprise a dense line or thin film target. This flat signal variation with focus means that there is no sensitivity improvement; however there should be additional cancelling of process and tool dependent effects.

As mentioned, the target may comprise actual product features, rather than a metrology target specifically designed and formed for the purposes of measurement. Such targets may therefore comprise functional parts of devices formed on the substrate. Where a target comprises actual product features which show a Bossung relationship through focus, the second target may comprise an area on the substrate which shows either no such Bossung relationship or a weak Bossung relationship. The second target should be sufficiently near to the first target, such that it is within the focus correlation length. The focus correlation length for a lithographic apparatus is a measure of the distance for which there is little or no focus variance. This distance may be less than 2 mm, or less than 1.5 mm for example. Alternatively, where the second target is a "thin film" showing no Bossung relationship with focus (but having measurement tool and processing information), it may be possible to have the first and second targets at a greater separation, possibly up to 0.5 cm or even 1 cm. However, a separation within the focus correlation length would still be preferred. In an embodiment where the second target is a thin film target, there may be provided only one such target (or a few) per field or only a few per wafer. This would mean the same second target being measured during the second measurement for different first targets. However, this could result in quite large distances between first and second targets, possible larger even than 1 cm.

In a specific embodiment, the first and second targets may have different pitches. In such an embodiment, the ratio of the first wavelength used to measure the first target and the pitch of the first target should be substantially the same as the ratio of the second wavelength used to measure the second target and the pitch of the second target. In an embodiment, this ratio may be 1 (i.e., the first target has a pitch x nm and the measurement radiation used to measure that target has a first wavelength of x nm; similarly the second target has a pitch y nm and the measurement radiation used to measure that target has a second wavelength y nm). In this way, as a result of the well-known diffraction equation, the diffraction orders within each pupil image will overlap (show a pixel-to-pixel correlation). This enables a pixel-to-pixel subtraction to be performed to obtain the first metric.

Figure 8A:
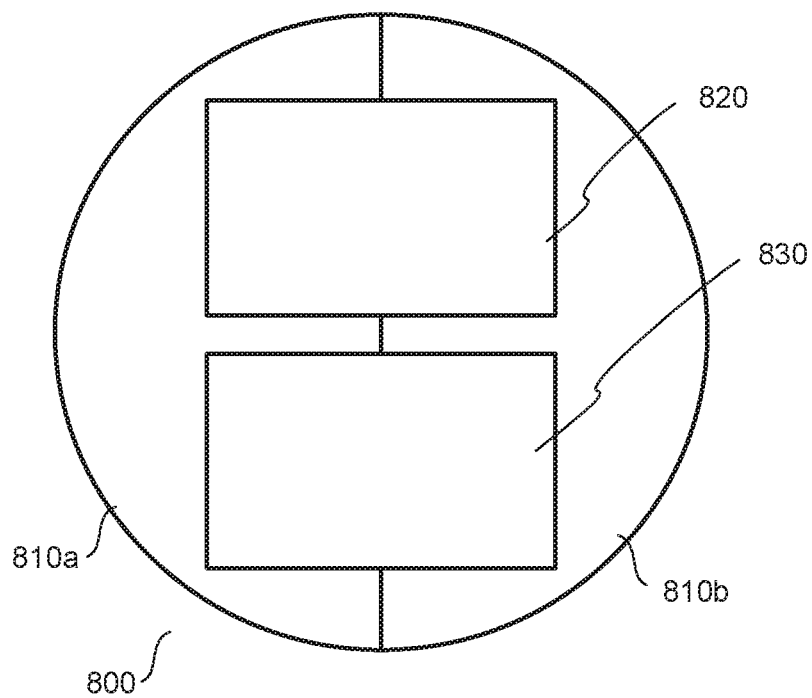
FIGS. 8(a)-8(b) show (a) the simultaneous capture of four measurements and (b) the resultant image.
Figure 8B:
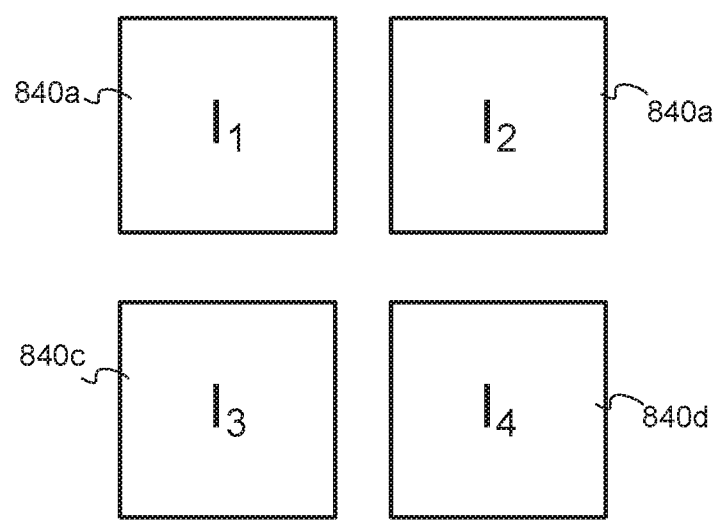

In a specific dark field imaging embodiment, the four measurements described above, for obtaining two differentials, can all be performed simultaneously in a single capture. This is illustrated by FIG. 8. FIG. 8(a) shows the measurement field (or measurement spot) 800, divided into two wavelengths such that the measurement subfield 810a comprises measurement radiation of wavelength λ1 and measurement subfield 810b comprises measurement radiation of wavelength λ2. Inside the measurement spot are two targets being measured simultaneously: (in this example) a line target 820 and a trench target 830. The resultant sensor image (for example as seen on sensor 23 of FIG. 3(a)), is shown in FIG. 8(b). This shows the image divided into four regions of interest 840a, 840b, 840c, 840d, comprising four intensity measurements I1, I2, I3, I4. The focus measurement f can be derived from a metric obtained from such measurements according to the following:

$$f \propto \frac{I_1 - I_2}{I_1 + I_2} - \frac{I_3 - I_4}{I_3 + I_4}$$

as before the scaling (denominator sum factors) are optional. This is only an example and other more complex relationships are also possible.

Numerous measurements can be made on each target, from which a number of differentials (or other combinations) can then be obtained. For example, measurements could be made of a target using multiple measurement radiations. By way of specific examples, these may comprise a first measurement radiation having a first wavelength and first polarization, a second measurement radiation having a second wavelength and first polarization, a third measurement radiation having a first wavelength and second polarization, and a fourth measurement radiation having a second wavelength and second polarization. As before, additional measurements of other targets can also be made to obtain further differentials. Increasing the number of measurements in this manner can enhance the application robustness (remove common cross-terms), and increase the chance that useable signals will be found which support the application of measuring focus and dose.

Multiple comparable (difference) measurements may be combined in one focus measurement for averaging purposes, or to use an appropriate fit model (e.g. higher order polynomial fit instead of simple differential). Also, the sum of certain signal components, instead of their difference, may be used in combination to qualify tool-to-tool differences or processing effects. For example, the sum of measurements from different wafer rotations could provide cancelling of processing effects.

In an embodiment, machine learning techniques may be used on the differential pupil images obtained using methods as described herein, to extract the lithographic process parameter (e.g., focus and/or dose) value from them. The machine learning techniques, for example, may be as described in WO2013/079270, herein incorporated by reference. This document describes determining at least one discriminant function for the diffraction pupil images, the discriminant function being able to classify the input pupil images in terms of a process variable, which in this example is focus (although can be dose or other lithographic process parameter). The discriminant function can then be used to classify subsequent input pupil images. The input pupil images may be combination pupil images as described or may be single pupil images. When single pupil images, the machine learning algorithm can decide whether a combination pupil image is beneficial and substitute (or calculate) these when appropriate. The combination pupil images may be differential pupil images, as described.

It is known to use a model to describe CD (and sidewall angle) as a function of focus and dose, this focus-dose model being calibrated using experimental data from a "set-get" experiment such as a focus exposure matrix (FEM). A "set-get" experiment is one where the focus is set with a range of offsets and measurements are made to obtain or "get" the CD or SWA. A FEM wafer may be used as calibration wafer for the scatterometer. As is known in the art, a FEM wafer comprises a wafer that has been coated with a photoresist onto which a pattern is exposed with multiple combinations of focus and exposure offsets. The FEM wafer is measured by the metrology tool to determine SWA and CD using the computationally intensive reconstruction methods described above. Calibration data is collected for varying focus and dose, and all collected calibration data with the different values of focus/dose are utilized for calibration of the focus-dose model's fitting parameters. The calibrated model can then be used to measure and infer the focus values for subsequent measurements.

The machine learning technique enables a lithographic process parameter value to be obtained from an input combination pupil image by application of pattern recognition, matching the input (e.g., combination) pupil image to a closest pupil image obtained from measurement of the FEM. Such methods may mean that the relationship between the first metric with the lithographic process parameter need not even be monotonic. Machine Learning or other algorithms may still be able to extract values for the lithographic process parameter from multiple components, each depending non-monotonically on the lithographic process parameter. The machine learning techniques described in WO2013/079270 are only provided by way of example, any other suitable machine learning technique or other mathematical technique may be used to extract the lithographic process parameter (e.g., focus and/or dose) from the combination pupil image.

As taught in WO2013/079270, the discriminant function is a function that takes as its input the feature vector, which may be a vectorized pupil image, and returns (in the binary case) a 1 or a 0. If the discriminant function returns a 1, the measured feature is classified in class A, else it is classified in class B. Typical discriminant functions include inter alia logistic regression, support vector machines and linear discriminant analysis. This discriminant function may be determined via an experiment. For example, suppose that many pupil measurements are obtained from a wafer that was processed with a negative focus offset. These sets of measurements are labelled as class A. Similarly, pupil measurements are also obtained from a wafer that was processed with a positive focus offset. These sets of measurements are labelled as class B. Standard model identification steps can be utilized to determine a discriminant function from this data, that is a function that will categorize a pupil image as class A or class B. A cost function is defined and minimized over the model parameters. The resulting model (discriminant function) is then tested and validated. Once an accurate model has been identified, it can be employed to classify new measurements as coming (for example) from a negative focus offset (defocus of pupils labelled "class A") or positive focus offset (defocus of pupils labelled "class B").

The above example details pair-wise (binary) classification to provide a simple example for explanation. However, greater resolution is obtained by having more than two classes. Each class may correspond to a different focus and/or dose condition. As measurements of an FEM will yield essentially discrete data (there are a finite number of focus/dose settings used during exposure of the FEM), classes can be designated for each of these settings. In this way, during a calibration stage, the algorithm will receive pupil images from measurements taken from the FEM, and use these in combination with the corresponding known focus/dose settings (and therefore class) for each pupil image so as to learn which pupil image patterns are likely to belong to each class. An accurate model can then be constructed which will classify, in an inference stage, subsequent pupil images into these classes, each class corresponding to a particular focus and/or dose condition. In this way, focus/dose conditions can be inferred from input pupil images in this inference stage.

Discrete (classification) is only one possible model form. A continuous (regression) model form is also possible. Continuity could simply be assumed and an appropriate algorithm used; for example, Support Vector Regression rather than Support Vector Classification. Alternatively, it may be that it is initially determined whether there is continuity in the domain, before employing a regression model. This can be assessed using the likelihood of a particular pupil belonging to a certain class. When a pupil image is misclassified, it is determined where it is misclassified (i.e., how badly it is misclassified). For example, if the true focus is 0 nm and the pupil image is misclassified: it is determined whether the pupil image is misclassified within the next closest class (e.g., −15 nm or 15 nm), or is it misclassified far away, say at 100 nm. A multi-class confusion matrix can be used to visualize this. If the confusion matrix shows only a few misclassifications and that these are around the diagonal, then it can be assumed that there is continuity between the class labels. Thus, it is valid to regress a continuous function through these class labels.

The machine learning may comprise, as an initial step, a dimensionality reduction on the input vectorised pupil. Given all the measurements made over the wafer with varying focus/dose settings and given all the pixels in the pupil image, it is notable that there are only 3 or 4 independent signals. In other words, only three eigenvectors are needed to describe the covariance matrix of the vector. The remainder of the 2000 or so pixels are linearly dependent and add no further information. This pre-processing and shrinking of the input vector from 2000 to 3 is known as dimensionality reduction. A technique to do it is principal component analysis (PCA). This reduction is significant since there are only a few sources of covariance for this experiment. It is hoped to see at least two sources of covariance where focus and dose have been varied (or only one if only a single parameter is varied). It can be seen that these two sources make up more than 95% of the covariance, which means that there is a strong sensor response to focus and dose.

Where a PCA is performed, the machine learning algorithm may use only the PCA component values (coefficients) as an input, and not the full vectorised pupils. The machine learning may then comprise determining the relationship between the principal components and focus (or the relevant lithographic process parameter). The multidimensional relation between the principal components and focus may be anything, but the relation should be unique (without crossing itself). This relationship should not change between measurement tools, nor with any process variation, such as inter alia dose, resist thickness, aberration, resist processing. Focus and/or dose can then be inferred in the inference stage. This comprises determining the coefficients of the principal components for a newly observed image pupil. From their magnitude and the known relationship, focus (or the relevant lithographic process parameter) can be determined.

The measurements described herein may be performed using various illumination conditions. Such conditions may include a quartered aperture or conventional illumination. It may include averaged measurements of a target at orientations 180° apart. The measurement radiation may be X/Y polarized (actually an average of the two linear polarizations), or of a single polarization. However a difference (or other combination) metric can be obtained using measurement radiation of different polarizations.

Figure 9:
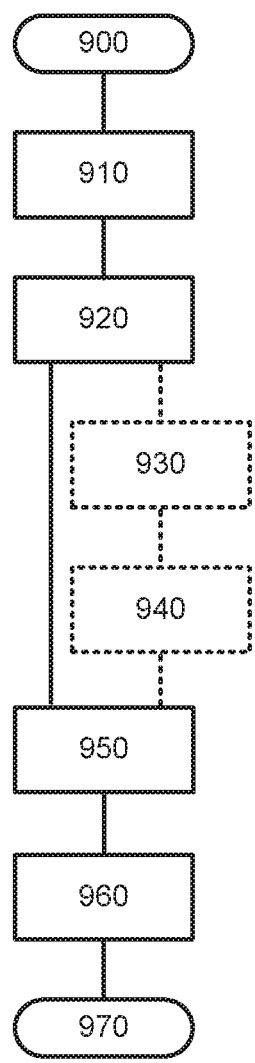
FIG. 9 is a flowchart of a method of monitoring a lithographic process parameter according to an embodiment of the invention.

FIG. 9 is a flowchart of the steps of a method for monitoring a parameter of a lithographic process, such as a focus and/or dose parameter, according to an exemplary embodiment. The steps are as follows, and are then described in greater detail thereafter:

900—Start

910—Perform a first measurement and second measurement of at least a first target with, respectively, a first measurement configuration and a second measurement configuration.

920—Obtain a first metric from said first measurement and said second measurement.

930—Optionally, perform further measurements with further measurement configurations.

940—Obtain at least a second metric from said further measurements and use the second metric to obtain one or more further differentials.

950—Calculate focus and/or dose (or other lithographic process parameter) from at least said first metric and, when calculated, said second metric;

960—Use calculated focus and/or dose measurement in focus and/or dose setting for subsequent exposures.

970—End.

At step 910, a first measurement of a target is performed using a first measurement configuration and a second measurement of a target is performed using a second measurement configuration. The first and second measurement configurations may differ in terms of the measurement radiation used; for example, one or more of wavelength, polarization or illumination profile (angle of incidence) may be varied between the first and second measurements. More specifically, the first measurement may use a first measurement radiation of a first wavelength (or first polarization) and the second measurement may use measurement radiation of a second wavelength (or second polarization). The first and second measurement configurations may alternatively comprise measurements of different targets or measurements of a different detection angular distribution. These measurements may be performed using any of the methods and variations disclosed herein, and may be, for example, of zeroth order and/or first order (or any higher orders) scattered radiation.

At step 920, a first metric (which may be a first difference or other combination) is calculated. This may be a difference of the first measurement and the second measurement.

At step 930, optional further measurements may be performed, each with a different measurement configuration. For example, an optional third and fourth measurement may be performed. The third measurement may be of a second target (said first and second measurements being of a first target) using the first measurement radiation, and the fourth measurement may be of the second target using the second measurement radiation. The first and second targets may take the form of any of the combinations disclosed herein. Ideally, they should show opposite Bossung variance through values for the lithographic process parameter being monitored (e.g., focus and/or dose), or at least one target should show Bossung variance through the parameter values, with the other target showing no, or only weak Bossung variance.

At step 940, at least a second metric is determined from the further measurements. This second metric may be the difference of said third measurement and said fourth measurement. A third difference can then determined as the difference of the first difference and the second difference. Further differentials can be obtained, depending on the number of measurements and different measurement configurations.

At step 950, the lithographic process parameter being monitored can be determined or inferred from the first and second metrics, and more specifically the first difference or third difference as appropriate. This can be done directly or using a machine learning algorithm as described herein.

At step 960, the calculated parameter value can then be used in parameter monitoring during subsequent lithographic processes, so as to maintain focus accuracy and consistency during exposure.

A method of manufacturing devices using the lithographic process can be improved by providing an inspection apparatus as disclosed herein, using it to measure processed substrates to measure parameters of performance of the lithographic process, and adjusting parameters of the process (particularly focus and/or dose) to improve or maintain performance of the lithographic process for the processing of subsequent substrates.

It should be understood that the particular parameters used in the above examples are not the only parameters that may be defined. Additional and/or alternative parameters can be used in a real design process, according to limitations of the lithographic apparatus and the inspection apparatus to be used for the metrology. While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the physical grating structures of the targets as realized on substrates and patterning devices, an embodiment may include a computer program containing one or more sequences of machine-readable instructions describing a methods of designing metrology recipes and/or controlling the inspection apparatus to implement the illumination modes and other aspects of those metrology recipes. This computer program may be executed for example in a separate computer system employed for the design/control process. Alternatively, the design process may be wholly or partly performed within unit PU in the apparatus of FIG. 3, 4 or 5 and/or the control unit LACU of FIG. 2. There may also be provided a data storage medium (e.g., semiconductor memory, magnetic or optical disk) having such a computer program stored therein.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Further embodiments according to the invention are provided in below numbered clauses:

1. A method of monitoring a lithographic process parameter of a lithographic process, said method comprising:

acquiring a first target measurement, said first target measurement having been obtained from inspection of a target performed with a first measurement configuration;

acquiring a second target measurement, said second target measurement having been obtained from inspection of a target performed with a second measurement configuration, wherein at least one measurement parameter is varied between said first measurement configuration and said second measurement configuration; and determining the lithographic process parameter from a first metric derived from said first target measurement and said second target measurement.

2. A method according to clause 1 wherein said first metric scales with a first difference, said first difference being the difference of said first target measurement and said second target measurement.

3. A method according to clause 1 or 2 wherein said first metric is divided by an average of said first target measurement and said second target measurement.

4. A method according to any preceding clause wherein a variation of the lithographic process parameter with a measured value for a target parameter determined from said first target measurement defines a first curve and a variation of the lithographic process parameter with a measured value for a target parameter determined from said second target measurement defines a second curve, said first curve and second curve each being substantially symmetrical around a peak representing a best value for the lithographic process parameter, said first curve and second curve being mutually substantially similar but having a relative offset on the lithographic process parameter axis, and wherein a variation of said first metric with the lithographic process parameter is substantially monotonic.

5. A method according to clause 4 wherein the variation of said first metric with the lithographic process parameter is substantially linear.

6. A method according to clause 5 wherein the variation of said first metric with the lithographic process parameter is defined by a line having a slope dependent upon the curvature of said curves and a difference in said varied measurement value parameter.

7. A method according to any preceding clause wherein said varied measurement parameter is a target parameter, said first and second measurements being performed on first and second targets respectively.

8. A method according to clause 7 wherein said target parameter comprises pitch and/or a feature dimension of said target.

9. A method according to any of clauses 1 to 6 wherein said varied measurement parameter comprises detection angular distribution.

10. A method according to any preceding clause comprising acquiring further target measurements, each target measurement with a different measurement configuration and using these when determining the lithographic process parameter, so as to cancel for processing and apparatus dependent errors.

11. A method according to any of clauses 1 to 6 wherein said first measurement configuration comprises using a first measurement radiation to inspect said target and said second measurement configuration comprises using a second measurement radiation to inspect said target.

12. A method according to clause 11 wherein said varied measurement parameter between said first measurement radiation and second measurement radiation is one or more of: wavelength, polarization and illumination profile.

13. A method according to clause 11 wherein said varied measurement parameter between said first measurement radiation and second measurement radiation is wavelength.

14. A method according to any of clauses 11 to 13 wherein said first target measurement and said second target measurement have been obtained by inspection of the same target, said target comprising a first target.

15. A method according to clause 14 comprising acquiring further target measurements, each target measurement with a different measurement configuration and using these when determining the lithographic process parameter, so as to cancel for processing and apparatus dependent errors.

16. A method according to clause 15 wherein said acquiring further target measurements comprises:

acquiring a third target measurement, said third target measurement having been obtained from inspection of a second target using said first measurement radiation;

acquiring a fourth target measurement, said fourth target measurement having been obtained from inspection of a second target using said second measurement radiation;

wherein the step of determining the lithographic process parameter from a first metric comprises determining the lithographic process parameter from said first metric and from a second metric derived from said third target measurement and said fourth target measurement.

17. A method according to clause 16 wherein said second metric is a second difference, said second difference being the difference of said third target measurement and said fourth target measurement.

18. A method according to clause 17 comprising:
determining at least a third difference, said third difference being the difference of said first difference and said second difference;
wherein the lithographic process parameter is determined from said third difference.

19. A method according to clause 16 wherein said further target measurements comprise more than said third and fourth measurements, and said method comprises obtaining further differences from said further measurements, so as to further cancel for processing and apparatus dependent errors.

20. A method according to any preceding clause wherein said first target and said second target each comprise a grating having the same pitch but different feature dimension.

21. A method according to clause 20 wherein said feature dimension is critical dimension.

22. A method according to clause 20 or 21 wherein the width of each of the features of the first target is substantially equal to the width of each trench between features in the second target, and the width of each trench between features in the first target is substantially equal to the width of each of the features of the second target.

23. A method according to any of clauses 16 to 19 wherein said first target comprises target features, and a variation of a dimension of said target features with said lithographic process parameter defines a curve which is substantially symmetrical around a peak representing a best value for the lithographic process parameter, and wherein said second target comprises no features which show a similar curve relationship with said lithographic process parameter, or features which show only a weak curve relationship with said lithographic process parameter relative to that of the first target.

24. A method according to any of clauses 1 to 13 wherein said first target measurement is a measurement of a first target and said second target measurement is a measurement of a second target; and a first ratio of a pitch of said first target to said first wavelength and a second ratio of a pitch of said second target to said second wavelength are substantially equal.

25. A method according to clause 24 wherein said first ratio and said second ratio equal 1:1.

26. A method according to any preceding clause wherein said target measurements are imaged at a pupil plane, and each target measurement yields a pupil image comprising a plurality of pixel intensities.

27. A method according to clause 26 wherein said first metric is derived from a combination pupil image, said combination pupil image being a combination of a first pupil image resultant from said first target measurement and a second pupil image resultant from said second target measurement.

28. A method according to clause 27 wherein said combination pupil image is a difference pupil image, said difference pupil image comprising a plurality of pixel intensity values, each of which being derived from a difference of corresponding pixel intensity values from said first pupil image and said second pupil image.

29. A method according to clause 27 or 28 comprising determining a region of interest from within said combination pupil image and averaging the pixels intensities within this region of interest to derive said first metric.

30. A method according to clause 27, 28, or 29 comprising inferring said lithographic process parameter by using a machine learning algorithm on said combination pupil image.

31. A method according to clause 30 wherein said machine learning algorithm comprises determining a model of the relationship between said lithographic process parameter and said combination pupil images; and
using said model to categorise further combination pupil images.

32. A method according to clause 31 wherein said model comprises a discriminant function.

33. A method according to clause 31 or 32 wherein said determining of a model comprises:
obtaining a plurality of combination pupil images, each corresponding to a known lithographic process parameter condition;
determining a discriminant function from said plurality of combination pupil images and corresponding known lithographic process parameter conditions, said discriminant function being able to assign a lithographic process parameter condition to subsequent combination pupil images.

34. A method according to clause 33 comprising:
using said discriminant function to determine the process parameter condition for each of said subsequent combination pupil images.

35. A method according to any of clauses 30 to 34 wherein said machine learning algorithm comprises an initial dimensionality reduction step.

36. A method according to clause 35 wherein said dimensionality reduction step comprises performing a principal component analysis on the combination pupil images, the subsequent steps of the machine learning algorithm using principal component values corresponding to the combination pupil images in place of the combination pupil images.

37. A method according to any of clauses 1 to 25 wherein said target measurements are imaged at an image plane, and each target measurement yields an intensity value.

38. A method according to clause 37 comprising the steps of performing a first measurement of a target to obtain said first target measurement and performing a second measurement of a target to obtain said second target measurement.

39. A method according to clause 38 comprising performing said first and second measurement simultaneously.

40. A method according to any preceding clause wherein said lithographic process parameter is focus.

41. A method according to any of clauses 1 to 39 wherein said lithographic process parameter is dose.

42. A method according to any of clauses 1 to 39 wherein said lithographic process parameter is focus and dose.

43. A metrology apparatus for measuring a parameter of a lithographic process, the metrology apparatus being operable to perform the method of any of clauses 1 to 42.

44. A metrology apparatus according to clause 43 comprising:
a support for said substrate having a plurality of targets thereon;
an optical system for measuring each target; and a processor.

45. A lithographic system comprising:
a lithographic apparatus comprising:
an illumination optical system arranged to illuminate a pattern;
a projection optical system arranged to project an image of the pattern onto a substrate; and
a metrology apparatus according to clause 43 or 44,
wherein the lithographic apparatus is arranged to use the determined lithographic process parameter calculated by the metrology apparatus in applying the pattern to further substrates.

46. A computer program comprising processor readable instructions which, when run on suitable processor controlled apparatus, cause the processor controlled apparatus to perform the method of any one of clauses 1 to 42.

47. A computer program carrier comprising the computer program of clause 46.

48. A method of manufacturing devices wherein a device pattern is applied to a series of substrates using a lithographic process, the method including:
using the method of any of clauses 1 to 42 to monitor said lithographic process parameter, and
controlling the lithographic process for later substrates in accordance with the determined lithographic process parameter.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of monitoring a lithographic process parameter of a lithographic process, said method comprising:
acquiring a first target measurement, said first target measurement having been obtained from inspection of a target performed with a first measurement configuration;
acquiring a second target measurement, said second target measurement having been obtained from inspection of a target performed with a second measurement configuration, wherein at least one measurement parameter is varied between said first measurement configuration and said second measurement configuration; and determining the lithographic process parameter from a first metric derived from said first target measurement and said second target measurement by dividing said first metric by an average of said first target measurement and said second target measurement.

2. The method as claimed in claim 1, wherein said first metric scales with a first difference, said first difference being the difference of said first target measurement and said second target measurement.

3. The method as claimed in claim 1, wherein a variation of the lithographic process parameter with a measured value for a target parameter determined from said first target measurement defines a first curve and a variation of the lithographic process parameter with a measured value for a target parameter determined from said second target measurement defines a second curve, said first curve and second curve each being substantially symmetrical around a peak representing a best value for the lithographic process parameter, said first curve and second curve being mutually substantially similar but having a relative offset on the lithographic process parameter axis, and wherein a variation of said first metric with the lithographic process parameter is substantially monotonic.

4. The method as claimed in claim 1, wherein said varied measurement parameter is a target parameter, said first and second measurements being performed on first and second targets respectively.

5. The method as claimed in claim 1, comprising acquiring further target measurements, each target measurement with a different measurement configuration and using these when determining the lithographic process parameter, so as to cancel for processing and apparatus dependent errors.

6. The method as claimed in claim 1, wherein said first measurement configuration comprises using a first measurement radiation to inspect said target and said second measurement configuration comprises using a second measurement radiation to inspect said target.

7. The method as claimed in claim 6, wherein said first target measurement and said second target measurement have been obtained by inspection of the same target, said target comprising a first target.

8. The method as claimed in claim 7, comprising acquiring further target measurements, each target measurement with a different measurement configuration and using these when determining the lithographic process parameter, so as to cancel for processing and apparatus dependent errors.

9. The method as claimed in claim 8, wherein said acquiring further target measurements comprises:
acquiring a third target measurement, said third target measurement having been obtained from inspection of a second target using said first measurement radiation; and
acquiring a fourth target measurement, said fourth target measurement having been obtained from inspection of a second target using said second measurement radiation;
wherein the step of determining the lithographic process parameter from a first metric comprises determining the lithographic process parameter from said first metric and from a second metric derived from said third target measurement and said fourth target measurement.

10. The method as claimed in claim 1, wherein said first target and said second target each comprise a grating having the same pitch but different feature dimension.

11. The method as claimed in claim 10, wherein the width of each of the features of the first target is substantially equal to the width of each trench between features in the second target, and the width of each trench between features in the first target is substantially equal to the width of each of the features of the second target.

12. The method as claimed in claim 1, wherein said first target measurement is a measurement of a first target and said second target measurement is a measurement of a second target; and
a first ratio of a pitch of said first target to said first wavelength and a second ratio of a pitch of said second target to said second wavelength are substantially equal.

13. The method as claimed in claim 1, wherein said target measurements are imaged at a pupil plane, and each target measurement yields a pupil image comprising a plurality of pixel intensities.

14. The method as claimed in claim 13, wherein said first metric is derived from a combination pupil image, said combination pupil image being a combination of a first pupil image resultant from said first target measurement and a second pupil image resultant from said second target measurement.

15. The method as claimed in claim 1, wherein said target measurements are imaged at an image plane, and each target measurement yields an intensity value.

16. A metrology apparatus for measuring a parameter of a lithographic process, comprising:
an inspection device configured to:
acquire a first target measurement, said first target measurement having been obtained from inspection of a target performed with a first measurement configuration;
acquire a second target measurement, said second target measurement having been obtained from inspection of a target performed with a second measurement configuration, wherein at least one measurement parameter is varied between said first measurement configuration and said second measurement configuration; and
a determining device configured to determine the lithographic process parameter from a first metric derived from said first target measurement and said second target measurement by dividing said first metric by an average of said first target measurement and said second target measurement.

17. The metrology apparatus as claimed in claim 16, comprising:
a support for said substrate having a plurality of targets thereon;
an optical system for measuring each target; and
a processor.

18. A lithographic system comprising:
a lithographic apparatus comprising:
an illumination optical system arranged to illuminate a pattern;
a projection optical system arranged to project an image of the pattern onto a substrate; and
a metrology apparatus comprising:
an inspection device configured to:
acquire a first target measurement, said first target measurement having been obtained from inspection of a target performed with a first measurement configuration;
acquire a second target measurement, said second target measurement having been obtained from inspection of a target performed with a second measurement configuration, wherein at least one measurement parameter is varied between said first measurement configuration and said second measurement configuration; and a determining device configured to determine the lithographic process parameter from a first metric derived from said first target measurement and said second target measurement by dividing said first metric by an average of said first target measurement and said second target measurement, wherein the lithographic apparatus is arranged to use the determined lithographic process parameter calculated by the metrology apparatus in applying the pattern to further substrates measurement.

19. A non-transitory computer readable medium comprising processor readable instructions which, when run on suitable processor controlled apparatus, cause the processor controlled apparatus to perform operations comprising:

acquiring a first target measurement, said first target measurement having been obtained from inspection of a target performed with a first measurement configuration;

acquiring a second target measurement, said second target measurement having been obtained from inspection of a target performed with a second measurement configuration, wherein at least one measurement parameter is varied between said first measurement configuration and said second measurement configuration; and determining a lithographic process parameter of a lithographic process from a first metric derived from said first target measurement and said second target measurement by dividing said first metric by an average of said first target measurement and said second target measurement.

20. A method of manufacturing devices wherein a device pattern is applied to a series of substrates using a lithographic process, the method including:

monitoring said lithographic process parameter comprising:

acquiring a first target measurement, said first target measurement having been obtained from inspection of a target performed with a first measurement configuration;

acquiring a second target measurement, said second target measurement having been obtained from inspection of a target performed with a second measurement configuration, wherein at least one measurement parameter is varied between said first measurement configuration and said second measurement configuration; and determining the lithographic process parameter from a first metric derived from said first target measurement and said second target measurement by dividing said first metric by an average of said first target measurement and said second target measurement, and controlling the lithographic process for later substrates in accordance with the determined lithographic process parameter measurement.

* * * * *